United States Patent [19]

Terkelsen

[11] 4,289,570

[45] Sep. 15, 1981

[54] SEED AND METHOD FOR EPITAXIAL SOLIDIFICATION

[75] Inventor: Bruce E. Terkelsen, Cheshire, Conn.

[73] Assignee: United Technologies Corporation, Hartford, Conn.

[21] Appl. No.: 969,129

[22] Filed: Dec. 13, 1978

[51] Int. Cl.$^3$ .................. C30B 21/02; C30B 17/00
[52] U.S. Cl. ...................... 164/122.1; 156/DIG. 105; 156/616 R; 164/127; 164/122.2
[58] Field of Search ......... 156/616 R, 624, DIG. 105, 156/DIG. 100; 427/216; 428/403, 404; 164/60, 127

[56] References Cited

U.S. PATENT DOCUMENTS

| 3,264,697 | 8/1966 | Price et al. ............................ 428/614 |
| 3,494,709 | 2/1970 | Piearcey ................................ 75/171 |
| 3,598,169 | 8/1971 | Copley .................................. 164/361 |
| 3,759,310 | 9/1973 | Barrow et al. ......................... 164/60 |
| 3,857,436 | 12/1974 | Petrov et al. ........................ 156/616 R |
| 3,859,144 | 1/1975 | Basche et al. ......................... 148/6.3 |
| 4,005,988 | 2/1977 | Paulonis et al. ...................... 29/194 |
| 4,008,052 | 2/1977 | Vishnevsky et al. ................. 29/194 |
| 4,015,657 | 4/1977 | Petrov et al. ........................ 156/616 R |

FOREIGN PATENT DOCUMENTS

| 44-20732 | 9/1969 | Japan ................................ 164/72 |
| 48-43527 | 12/1973 | Japan ................................ 164/127 |

*Primary Examiner*—Gregory N. Clements
*Attorney, Agent, or Firm*—C. G. Nessler

[57] ABSTRACT

A seed and method for epitaxial solidification of materials, a preferred seed having at least a portion with a melting point 20°–45° C. depressed from that of the alloy being solidified into an article. Boron and silicon are preferably added to nickel superalloys seeds when directionally solidified columnar grain and single crystal articles are formed. Improved seeds also have surface compositions which promote the dissolution of surface contamination films that interfere with epitaxy.

5 Claims, No Drawings

SEED AND METHOD FOR EPITAXIAL SOLIDIFICATION

BACKGROUND OF THE INVENTION

1. Field of the Invention

This invention relates to directional solidification of metal castings, most particularly to the use of seeds for epitaxial solidification.

2. Description of the Prior Art

As indicated, my copending application Ser. No. 969,130 filed Dec. 13, 1978, the use of seeds for directional solidification of articles having controlled crystallographic orientation, at least along the principal axis of solidification, is well known. To obtain an article with a crystallographic orientation derived from a seed, it is necessary to partially melt the seed and thereafter progressively solidify the article, starting from the seed, so that epitaxy results in the article. It is axiomatic that a portion of the seed must at all times be colder than the molten metal, else it would melt fully and there would be no crystal structure from which to grow. As also described in more detail in the copending application referred to above, certain production processes will result in the seed as a whole being substantially colder than both the mold which surrounds it or the molten metal which is introduced to form the article. If sufficient heat is not imparted to the seed to melt a portion of its surface, then non-epitaxial solidification will occur on its surface and a defective casting will be produced. Therefore, the prevalent practice has been to use seeds of the same composition which the article will have and as a result difficulties arise in achieving adequate melting of the seed without undesirable other effects. Therefore, there is a need for improved methods of obtaining improved seed melting.

A further problem attending the use of seeds is that surface layers of oxides or other contamination compounds form and are not readily removed by contact with molten metal. It has even been found on occasion that the portion of the seed underlying the contaminated surface layer will be melted but the surface layer itself will not have been swept away, and by its continued presence will interfere with subsequent epitaxial solidification. As a result, there is a need for preventing or readily removing contaminated surface layers on seeds in a convenient and economic manner.

SUMMARY OF THE INVENTION

An object of the invention is to improve epitaxial solidification of articles from seeds.

According to the article and method of the invention, a seed with a predetermined crystallographic orientation and structure, which are formable in the metal alloy of the article being cast, has at least a portion which has a melting point which is depressed compared to that of the metal alloy of which the article is being cast. In a preferred embodiment, the melting point of the surface of the seed from which epitaxial growth is desired is depressed by the additions of silicon and boron of up to 10 percent. The surface is fully dissolvable by the melt, and epitaxy takes place from the remaining bulk thus exposed. An alternate embodiment includes the provision of a surface composition which enhances the dissolution, in the molten metal of the alloy being cast, of undesirable surface compounds which interfere with epitaxy. The invention is particularly adapted to forming single crystal parts in nickel superalloys. Melting point depressions of 20°-30° C., by the addition of boron to a nickel alloy seed, are found most useful to carry out the objects of the invention.

The invention provides for improved epitaxial solidification yields from seeds which are substantially cooler than the molten metal being introduced and which have undesirable surface compounds formed prior to the introduction of the molten metal. Control of crystallographic orientation in articles is increased, production rates are improved and costs lowered. The need for superheated molten metal to heat the seed is lessened, thereby reducing metal scrap in the production of articles.

DESCRIPTION OF THE PREFERRED EMBODIMENT

The preferred embodiment hereafter is described in terms of the formation of controlled orientation columnar grain and single crystal articles of nickel alloys, although the invention is equally applicable to other materials in which a controlled crystallographic orientation is desired. The seed is particularly useful within the invention of my copending application, "Method and Apparatus for Epitaxial Solidification", Ser. No. 969,130, which is hereby incorporated by reference.

According to the most common practice, epitaxial solidification of single crystal articles is carried out by controllably solidifying a metal alloy from a seed of the same metal alloy. Prior to making the article, a seed is fabricated, typically as a rod or bar, using techniques known in the art. It is analyzed by X-ray diffraction or other suitable means to determine its crystallographic orientation. Once the seed primary and secondary crystal orientations are determined and marked, the seed is machined as needed to the appropriate size and shape for the particular article to be cast. As one example, when a 10 cm high gas turbine blade is to be cast, the seed would typically be about a 2 cm long segment of a 2 cm diameter bar. When prepared, the seed is placed on a chill plate or other heat sink and exposed at the end of a mold in which the article is to be formed. Then a melt, that is, a quantity of molten metal, is introduced into the mold and caused to contact the seed. It is necessary that a portion of the seed be melted to ensure that the melt which subsequently solidifies on the surface of the remaining portion of the seed is epitaxial. To obtain a finished article, the seed is preferentially cooled to engender directional solidification from it, rather than other areas of the mold.

According to the invention, if at least a portion of the seed has a lower melting point than a seed of the metal alloy being cast, it is found that the ease of obtaining epitaxy is greatly increased. A preferred way of achieving an improved seed is to add an element of a type and quantity which is compatible with the metal of the melt. In nickel superalloys, a preferred approach is to alter the seed, before placement in the mold, at the surface where the melt will contact it by including an element, such as boron, in the surface.

The addition of boron to the surface of the seed can be achieved by electroless plating with the use of amine borane, after the manner described in U.S. Pat. No. 4,005,988, which is hereby incorporated by reference, or by deposition from a boron halide hydrogen reactant gas mixture (boronizing) after the manner of U.S. Pat. No. 3,859,144, which is hereby incorporated by reference. When boron is so deposited and diffused into the surface, its concentration will vary by the depth.

The concentration of boron can be varied as desired to achieve the object of the invention. The greater the melting point depression, the more easily the seed surface is melted. But for certain alloys it may be undesirable to have substantial quantities of boron in the metal alloy of the casting. The amount of boron which is liberated by melting of the surface of the seed is naturally dependent on, and controlled by, the quantity present in the seed and therefore it will be desirable to minimize the concentration of boron, both as to its depth and concentration, in such instances. In practice, with cast nickel superalloys common to the gas turbine industry, seeds having boron up to about 6 weight percent appears suitable. Amounts beyond this tend to decrease the melting point less but are still useful. An illustrative example of the practice of the invention is in the directional solidification of columnar grain articles from the commercial alloy PWA 1422. The alloy PWA 1422 has the nominal composition, by weight, of 10% cobalt, 9% chromium, 2% titanium, 5% aluminum, 12.5% tungsten, 2% hafnium, 1% columbium, 0.015% boron, and 0.11% carbon, balance nickel.

A seed for epitaxial solidification comprises a bulk portion with a PWA 1422 composition and desired crystallographic structure and a vapor deposited and partially diffused boron surface layer of about 75 to 125 microns depth. At the surface region, where the boron concentration is greatest, the boron will constitute about 4–5 weight percent of the alloy, and the altered alloy will have a melting point of about 35°–45° C. lower than the original alloy.

Other elements can be added to a seed in order to depress the melting point. For the example of nickel alloys, silicon is suitable in amounts up to 10 percent. Methods for depositing silicon from reactive gas mixtures are described in U.S. Pat. No. 3,859,144. Other elements having a similar effect in nickel and other base alloys will present themselves to those knowledgeable in the requisite metallurgical art.

An element such as boron further has the advantageous effect of producing a fluxing action on any oxide or other contamination layers which are formed on the seed surface. These layers can interfere with epitaxy, even when the seed underlying them is melted. Consequently, boron and silicon will not only promote local melting when the melt is introduced into the seed presence, but any film which was present on the seed will be dissolved in the localized boron or silicon rich area. Of course, once the surface of the seed crystal melts, any turbulence or convective currents in the melt will cause the dispersal of seed portion containing the melting point depressant. The depth of melting of the seed will be determined by the amount of superheat in the molten metal, the compositional gradient of the depressants in the seed, the size of the seed, and the heat transfer from the seed. It is not necessary nor desirable that the major part of the seed be melted. Only sufficient quantity of the seed need be melted to ensure that any growth in the vicinity is epitaxial with respect to the seed microstructure. Once the superheat of the molten metal is lost, either by increasing the enthalpy of the mold-seed system or by conduction of heat from the system, the melting of the seed ceases and, thereafter solidification of the molten metal ensues according to the practice of directional solidification and controlled heat extraction.

In another approach, the surface of the seed may be coated with a material which forms an oxide which is soluble readily in the molten metal of the casting but which does not have a depressed melting point. As an example, the surface of a PWA 1422 seed may be coated by an electroplate of pure nickel to a thickness of up to 2 mils. PWA 1422, being an oxidation and corrosion resistant nickel base superalloy, forms a relatively stable oxide layer. In contrast, the oxides of nickel are not particularly stable, and in fact, are soluble readily in molten PWA 1422 alloy. Consequently, when a nickel-rich layer is provided on the surface of the seed, the nickel and nickel oxide are dissolved in the melt and a clean surface of the seed is provided for subsequent epitaxial solidification. Of course, the presence of the nickel layer does not cause a melting point depression.

It is notable that the first portion of the seed, which has the composition alteration to produce a lower melting point, need not have the controlled crystallographic orientation of the second or major portion of the seed, provided the first portion is of such a size that it is fully dissolvable in the melt. This permits polycrystalline depressed melting point portions on single crystal seeds, by way of example.

A further embodiment of the invention is that the entire seed has a composition with either the depressed melting point or surface film dissolving characteristics. It is, of course, required that the seed have a crystallographic structure and nature from which epitaxial solidification of the melt can take place, and this would prevent the use of seeds of grossly dissimilar nature. If the seed has an entire bulk with a substantially different melting point, the melting of the portion of the seed where the melt contacts it will be dependent on the initial thermal conditions, the composition of the seed alloy, and the amount and temperature of the molten metal introduced into the seed region. As is pointed out in my above-mentioned copending application "Method and Apparatus for Epitaxial Solidification", when making single crystal castings, it is convenient to have a starter section of the mold, containing the seed and receiving the molten metal which melts the seed, separated from the article section by a substantially smaller selector section. Through such a configuration, molten metal which enters the starter section and partially dissolves the seed will be contained in a reservoir of that section, and therefore any melting point depressant or other element liberated into the melt will not be included in the metal solidified in the article section.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of my invention, that which I claim as new and desire to secure by Letters Patent of the United States is:

1. The method of directionally solidifying a metal melt into an article with controlled crystallographic orientation using a seed and epitaxial growth, comprising the steps of:
   (a) altering the composition of at least a portion of the seed using an element which lowers the melting point and which promotes dissolution in the melt of undesirable surface compounds, where the seed is adapted to contact the melt;

(b) providing a mold to contain the seed and to receive the melt;

(c) pouring molten metal into the mold to contact the seed and thereby melt the surface portion of the seed where its composition is altered; and (d) directionally solidifying the melt to promote epitaxial growth from the seed.

2. The method of claim 1 wherein the portion of the seed which is altered in composition in a manner sufficient to lower the melting point at least 20° C., compared to an unaltered seed.

3. The method of claims 2 wherein the seed is formed of a nickel alloy and the portion of the seed which is altered in composition contains up to 10 weight percent of an element selected from the group consisting of boron and silicon mixtures thereof.

4. The method of claims 2 wherein the portion of the seed which is altered is a surface layer of less than about 250 microns depth.

5. The method of forming single crystal articles by directional solidification of a metal alloy melt using epitaxial growth from a seed comprising the steps of:

forming a seed with a first portion which has a melting point more than 20° C. lower than the melting point of the metal alloy and which contains an element that promotes dissolution in the melt of undesirable surface compounds, and a second portion having substantially the same melting point as the metal alloy;

contacting the second portion of the seed with a cold chill plate;

providing a hot article mold on the chill plate in a manner which contains the seed without substantially heating it;

filling the mold with a melt of the metal alloy so that a part of the melt contacts the seed and dissolves the first portion; and epitaxially solidifying the melt from the second portion of the seed to form an article.

* * * * *

UNITED STATES PATENT AND TRADEMARK OFFICE
CERTIFICATE OF CORRECTION

PATENT NO. : 4,289,570

DATED : September 15, 1981

INVENTOR(S) : Bruce E. Terkelsen

It is certified that error appears in the above-identified patent and that said Letters Patent is hereby corrected as shown below:

In claim 2, column 5, line 10 "which" should be deleted

In claim 3, column 5, line 17 after "silicon" the words "and" should be inserted.

*Signed and Sealed this*

*Fourth* Day of *October 1983*

[SEAL]

*Attest:*

GERALD J. MOSSINGHOFF

*Attesting Officer*  *Commissioner of Patents and Trademarks*